United States Patent
Cosley et al.

(10) Patent No.: US 6,679,315 B2
(45) Date of Patent: Jan. 20, 2004

(54) SMALL SCALE CHIP COOLER ASSEMBLY

(75) Inventors: Michael R. Cosley, Crystal lake, IL (US); Richard L. Fischer, Lisle, IL (US); Jack H. Thiesen, Longmont, CO (US); Gary S. Willen, Boulder, CO (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 10/047,871

(22) Filed: Jan. 14, 2002

(65) Prior Publication Data

US 2003/0131972 A1 Jul. 17, 2003

(51) Int. Cl.[7] .............................. F28F 7/00; F28D 15/00; H05K 7/20; H01L 23/34
(52) U.S. Cl. ............................... 165/80.4; 165/104.26; 165/104.21; 165/168; 361/699; 361/700; 257/715
(58) Field of Search ........................... 165/80.4, 104.26, 165/104.33, 104.21, 168; 361/699, 700; 62/515; 257/714, 715

(56) References Cited

U.S. PATENT DOCUMENTS

| | | | | |
|---|---|---|---|---|
| 3,361,195 A | * | 1/1968 | Meyerhoff et al. | ......... 165/80.4 |
| 4,151,548 A | * | 4/1979 | Klein et al. | ................ 257/714 |
| 4,392,362 A | | 7/1983 | Little | |
| 4,498,118 A | | 2/1985 | Bell | |
| 4,561,040 A | * | 12/1985 | Eastman et al. | ............ 361/699 |
| 4,612,978 A | * | 9/1986 | Cutchaw | ................ 165/104.33 |
| 4,685,512 A | | 8/1987 | Edelstein et al. | |
| 4,866,570 A | * | 9/1989 | Porter | ........................ 361/689 |
| 4,940,085 A | * | 7/1990 | Nelson et al. | ............. 165/80.3 |
| 4,941,530 A | | 7/1990 | Crowe | |
| 5,067,047 A | | 11/1991 | Azar | |
| 5,088,005 A | | 2/1992 | Ciaccio | |
| 5,099,311 A | | 3/1992 | Bonde et al. | |
| 5,099,910 A | | 3/1992 | Walpole et al. | |
| 5,159,529 A | * | 10/1992 | Lovgren et al. | ............. 361/699 |

(List continued on next page.)

FOREIGN PATENT DOCUMENTS

WO    WO 84/02177   *   6/1984   ................. 165/80.4

OTHER PUBLICATIONS

Little William, Mar. 1978, IBM Corp, vol. 20 No. 10. p. 3919.*

(List continued on next page.)

Primary Examiner—Henry Bennett
Assistant Examiner—Tho V Duong
(74) Attorney, Agent, or Firm—Jones Day

(57) ABSTRACT

A microscale chip cooling system for a heat dissipating item, such as Intel's Pentium brand microprocessor. The system includes a 40 millimeter by 40 millimeter thermally insulated housing including a base and a cover. The system also includes a thermally conductive evaporator. The evaporator is adapted to be attached to a heat source such as the microprocessor. The cover includes inlet and outlet ports and the base includes a capillary passage. A refrigerant or heat transferring fluid is pumped or past through the passage before making a sudden expansion in an expansion zone just before passing to an evaporator chamber. Pool and flow boiling and forced convection may occur in the evaporator chamber as heat is transferred from the microprocessor through the thermally conductive evaporator to the refrigerant. The refrigerant then returns to a compressor to repeat the cycle. The system is extremely small and very efficient.

12 Claims, 7 Drawing Sheets

U.S. PATENT DOCUMENTS

| | | | |
|---|---|---|---|
| 5,169,372 A | | 12/1992 | Tecco |
| 5,179,500 A | * | 1/1993 | Koubek et al. ........ 165/104.33 |
| 5,183,104 A | | 2/1993 | Novotay |
| 5,218,515 A | | 6/1993 | Bernhardt |
| 5,220,809 A | * | 6/1993 | Voss ......................... 165/80.4 |
| 5,285,347 A | | 2/1994 | Fox et al. |
| 5,316,075 A | * | 5/1994 | Quon et al. ................ 165/80.4 |
| 5,365,749 A | | 11/1994 | Porter |
| 5,394,936 A | | 3/1995 | Budelman |
| 5,509,468 A | | 4/1996 | Lopez |
| 5,544,696 A | | 8/1996 | Leland |
| 5,587,880 A | | 12/1996 | Phillips et al. |
| 5,696,405 A | | 12/1997 | Weld |
| 5,769,154 A | * | 6/1998 | Adkins et al. ......... 165/104.26 |
| 5,823,005 A | | 10/1998 | Alexander et al. |
| 5,870,823 A | | 2/1999 | Bezama et al. |
| 6,039,114 A | * | 3/2000 | Becker et al. ............. 165/80.4 |
| 2003/0010050 A1 | | 1/2003 | Scott |

OTHER PUBLICATIONS

"Pool Boiling Heat Transfer From Plain and Microporous, Square Pin–Finned Surfaces in Saturated FC–72"; K.N. Rainey and S.M. You; Journal of Heat Transfer, vol. 122, pp. 509–516, Aug. 2000.

"Effects of Perpendicular Flow Entry on Convective Heat/Mass Transfer From Pin–Fin Arrays"; Chyu et al.; Journal of Heat Transfer; vol. 121, pp. 668–674, Aug. 1999.

"Pool Boiling Heat Transfer With an Array of Flush–Mounted, Square Heaters on a Vertical Surface"; S.M. You et al; Journal of Electronic Packaging; vol. 119, pp. 17–24, Mar. 1997.

"Combined Pressure and Subcooling Effects on Pool Boiling From a PPGA Chip Package"; A.A. Watwe et al; Journal of Electronic Packaging, vol. 199, pp. 95–105, Jun. 1997.

"Analytic Modeling, Optimization, and Realization of Cooling Devices in Silicon Technology"; Perret et al.; IEEE Transactions on Components and Packaging Technologies, vol. 23, No. 4, pp. 665–671, Dec. 2000.

"An Electrodynamic Polarization Micropump for Electronic Cooling"; J. Darabi and D. DeVoe; Journal of Microelectromechanical Systems, vol. 10, No. 1, pp. 98–106, Mar. 2001.

"Heat Transfer from Micro–Finned and Flat Surfaces to Flow of Fluorinert Coolant; Boiling Heat Transfer"; Mizunuma et al.; 1998 InterSociety Conference on Thermal Phenomena, pp. 386–391, Aug. 1998.

"Imersion Cooling of Electronics in Fluidized Beds of Dielectric Particles"; Robert C. Brown and Scott S. Jasper; Heat Transfer Engineering, vol. 10, No. 3 pp. 36–42, 1989.

"Optimal Structure for Microgrooved Cooling Fin fo High–Power LSI Devices"; S. Sasaki and T. Kishimoto; Electronics & Mechanics Technology Laboratories, Oct. 21, 1986.

"Gas Cooling Enhancement Technology for Integrated Circuit Chips"; Kishimoto et al.; IEEE Transactions of Components, Hybrids, and Manufacturing Technology, vol. CHMT–7, No. 3, pp. 286–293, Sep. 1984.

"The Effect of Tip Convection on the Performance and Optimum Dimensions of Cooling Fins"; K. Laor and H. Kalman; Int. Comm. Heat mass Transfer, vol. 19, pp. 569–584, 1992.

* cited by examiner

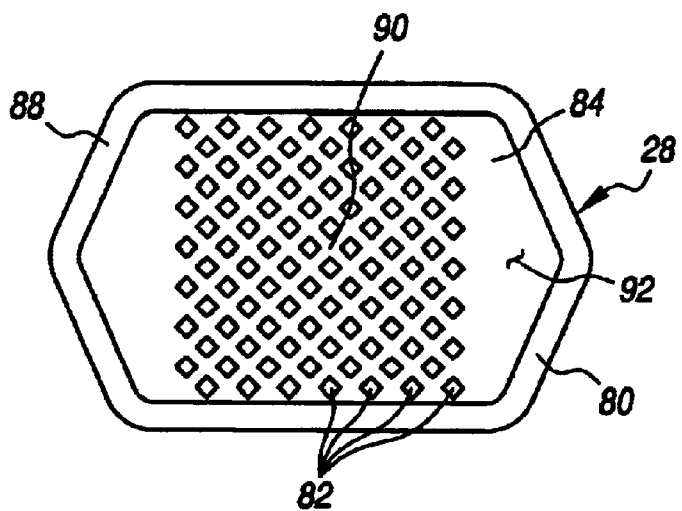
*FIG. 12*
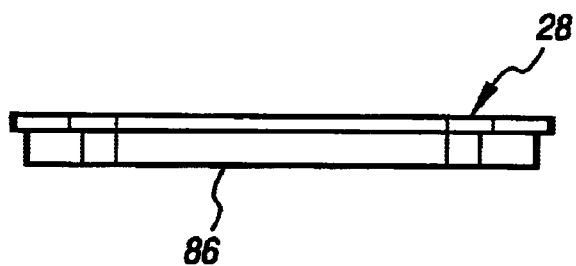
*FIG. 13*
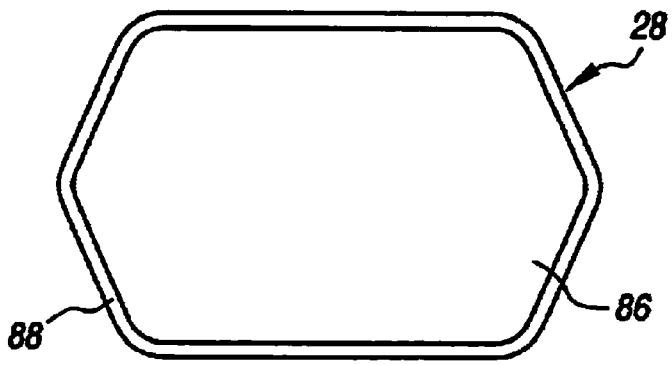
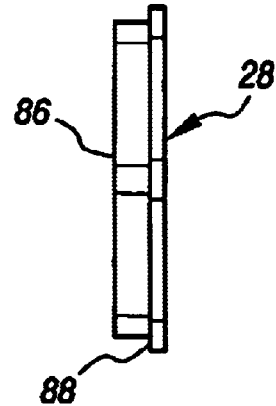
*FIG. 14*      *FIG. 15*

SMALL SCALE CHIP COOLER ASSEMBLY

BACKGROUND OF THE INVENTION

1. Field of the Invention

The present invention relates to a chip cooling assembly and more particularly to a very small-scale chip cooling assembly for efficiently and effectively cooling small but powerful electronic microprocessors or other small, heat generating devices.

2. Description of the Related Art

As microprocessors, such as Intel's Pentium brand series, become more powerful, they also generate more heat. To prevent failure and to ensure optimum capability, it is necessary to remove heat and to maintain the temperature of these microprocessors within a predetermined range. A number of different devices trying to accomplish this have been patented. These include the use of cold plates, microchannels, impingement jets and variations and combinations of these as well as other cooling devices. See for example, U.S. Pat. Nos. 4,392,362; 4,941,530; 5,183,104; 5,169,372; 5,394,936; 5,544,696; 5,696,405; and 5,870,823. The search, however, goes on for more effective, efficient and reliable cooling mechanisms.

BRIEF SUMMARY OF THE INVENTION

The below described embodiment improves upon the prior efforts and is a small scale cooler system comprising a housing, an inlet port formed in the housing for receiving a refrigerant or similar fluid, an outlet port formed in the housing, a thermally conductive element connected to the housing, an evaporator chamber operatively communicating with the housing where heat exchange takes place, a capillary passage formed in the housing extending downstream from the inlet port, and an expansion zone formed downstream of the capillary passage and in fluid communication with the evaporator chamber.

There are a number of advantages, features and objects achieved with the present invention which are believed not to be available in earlier related devices. For example, one advantage is that the present invention provides a very effective cooling system for very small heat dissipating items, such as electronic microprocessors. Another object of the present invention is to provide a small cooling system which is simple, reliable and economical. Yet another feature of the present invention is to provide a cooling system which is very small scale and easily attached to a small heat generating device. Yet a further feature of the present invention is to provide a cooling system flexible enough to transfer heat by forced convection, flow boiling, and pool boiling and any combination thereof.

A more complete understanding of the present invention and other objects, advantages and features thereof will be gained from a consideration of the following description of the preferred embodiment read in conjunction with the accompanying drawing provided herein.

BRIEF DESCRIPTION OF THE SEVERAL VIEWS OF THE DRAWING

FIG. 12 is a top plan view of a thermally conductive element of the cooling assembly shown in FIG. 1.

FIG. 13 is a side elevation view of the thermally conductive element.

FIG. 14 is a bottom plan view of the thermally conductive element.

FIG. 15 is a front elevation view of the thermally conductive element.

DETAILED DESCRIPTION OF THE INVENTION

Figure 1:
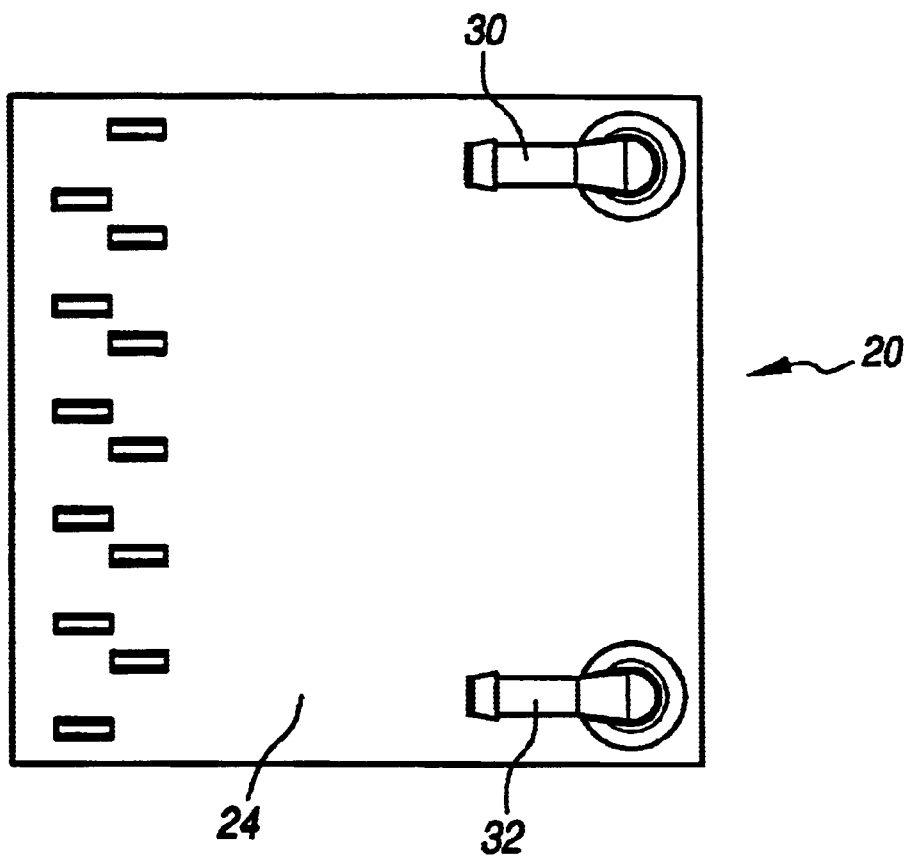
FIG. 1 is a top plan view of the cooling assembly described hereinbelow.
Figure 2:
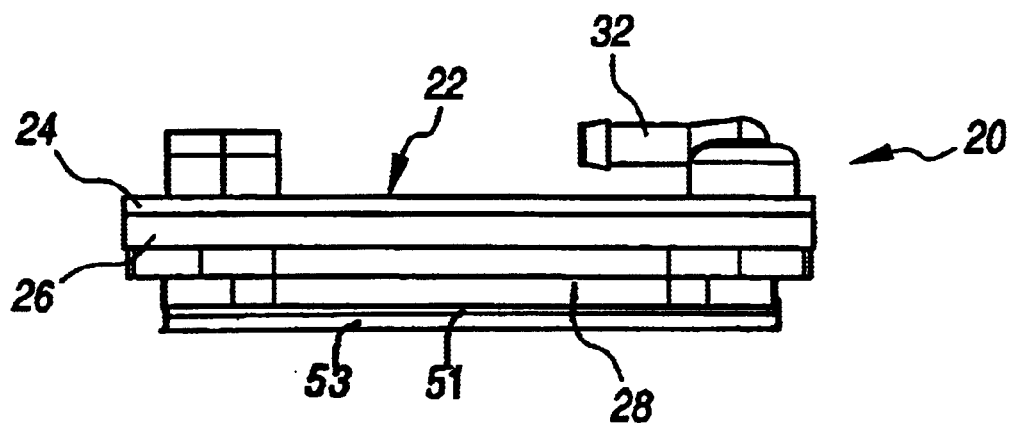
FIG. 2 is a side elevation view of the cooling assembly.
Figure 3:
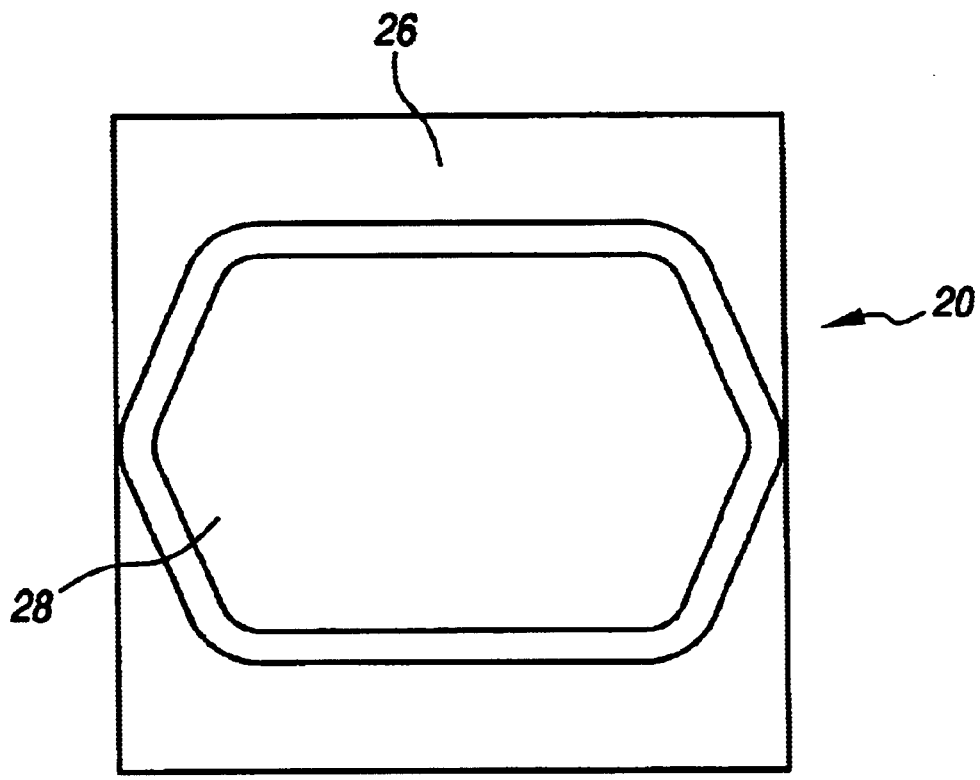
FIG. 3 is a bottom plan view of the cooling assembly.
Figure 4:
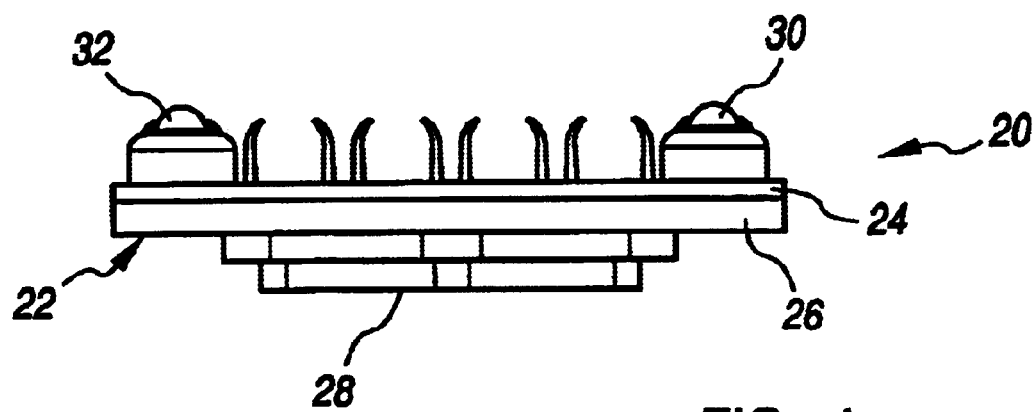
FIG. 4 is a front elevation view of the cooling assembly.

While the present invention is open to various modifications and alternative constructions, the preferred embodiment shown in the drawing will be described herein in detail. It is understood, however, that there is no intention to limit the invention to the particular form disclosed. On the contrary, the intention is to cover all modifications, equivalent structures and methods, and alternative constructions falling within the spirit and scope of the invention as expressed in the appended claims.

As used here, the term "microscale" refers to a very small scale consistent with the size of microchips, such as Intel's Pentium brand processor. A synonym of microscale is "mesoscale." The term "microsystem" refers directly to a microchip such as the Pentium brand processor. The reference to the Pentium brand processor is not to be considered limiting in any way and other microprocessors may be substituted. Also, future microprocessors of the same, similar, smaller or even larger size are considered within the scope, range and extent of the present invention. The term "pool boiling" involves the technology of boiling heat transfer and is a term well known by those skilled in the art. The term also appears in research articles such as the article, "Pool Boiling Heat Transfer From Plain And Microporous, Square Pin-Finned Surfaces In Saturated FC-72." This article appeared in the August, 2000 edition of the *Journal of Heat Transfer*, pages 509–516.

Referring now to FIGS. 1–4, an example of the claimed invention, in the form of a microscale cooling system 20, is illustrated. The system includes a housing 22, which is itself comprised of a cover 24 and a base 26. The system also includes an evaporator 28. Mounted to the cover are an inlet fitting 30 and an outlet fitting 32. The cover and base are made of any suitable thermally insulating synthetic resin, such as Nylon 6 or PBT. By the term "thermally insulating", it is meant a material having low thermal conductivity. The cover and base act as an insulator for refrigerant or other heat transferring fluid, liquid and gas flowing within the assembly. Formed between the base and the evaporator is an evaporator chamber to be described below.

Figure 5:
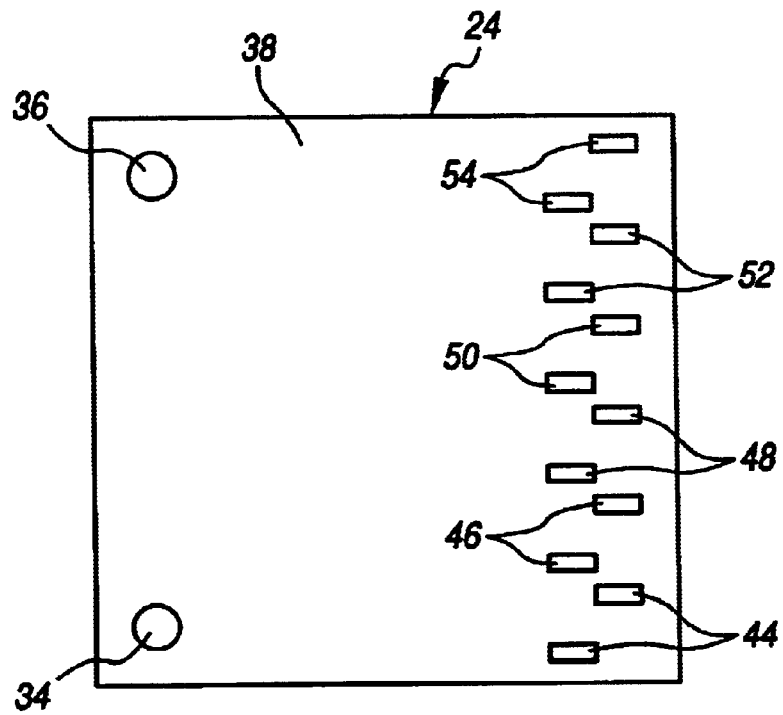
FIG. 5 is a top view of a cover of the cooling assembly rotated 180 degrees from that shown in FIG. 1.
Figure 6:
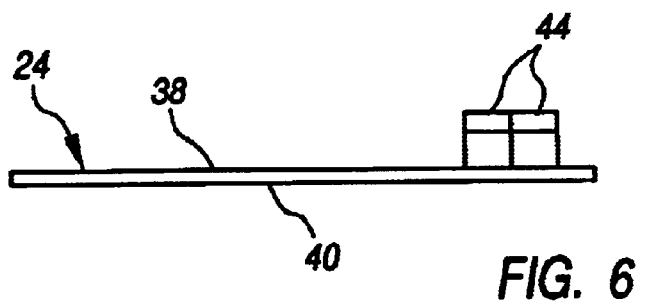
FIG. 6 is a side elevation view of the cover.
Figure 7:
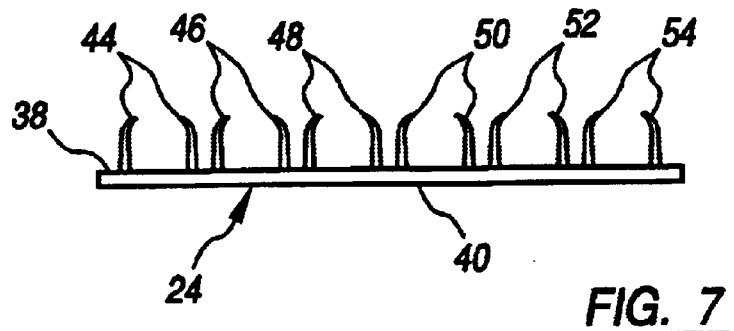
FIG. 7 is a rear elevation view of the cover.
Figure 8:
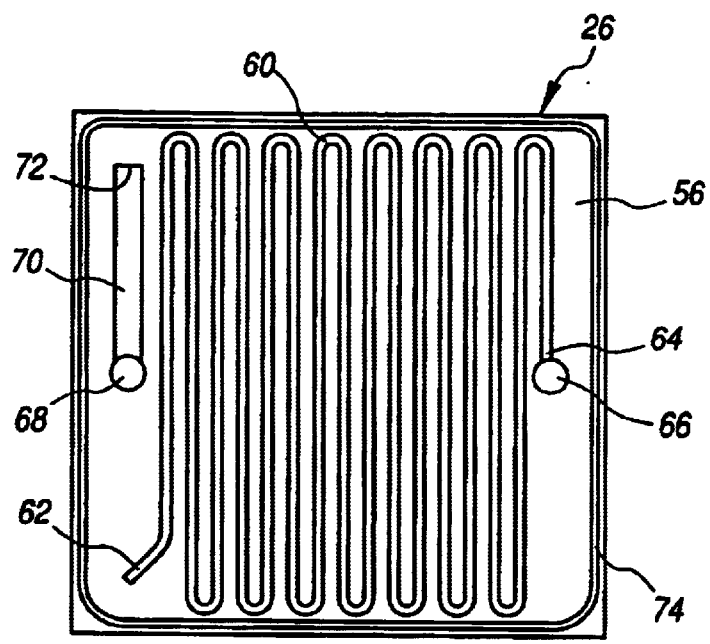
FIG. 8 is a top plan view of a base member of the cooling assembly shown in FIG. 1.
Figure 9:
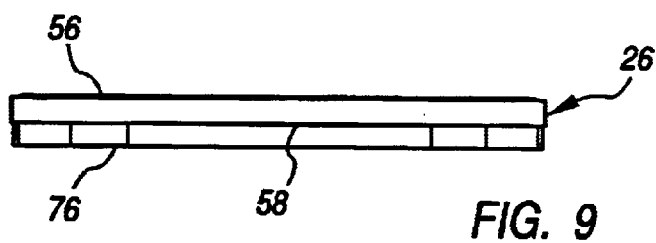
FIG. 9 is a side elevation view of the base.
Figure 10:
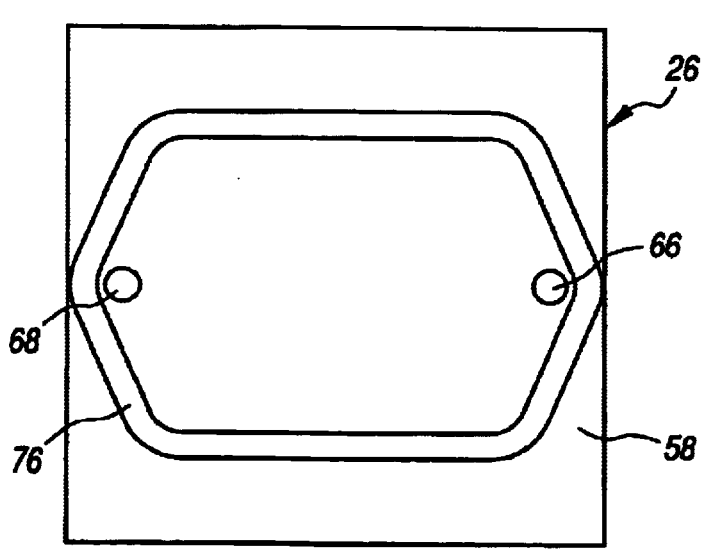
FIG. 10 is a bottom plan view of the base.
Figure 11:
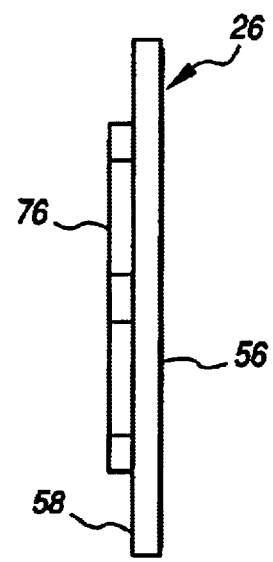
FIG. 11 is a rear elevation view of the base.

The cover 24 is a generally flat plate having two holes 34, 36, FIGS. 5–7, for forming inlet and outlet ports, respectively. The cover includes an outside surface 38 and an inside surface 40. Mounted to the cover on the outside surface are the inlet fitting 30 and the outlet fitting 32, FIGS. 1, 2 and 4. Also mounted to or formed on the outside surface of the cover are a series of paired grooming clips 44, 46, 48, 50, 52, 54 for aligning and constraining conduits (not shown) supplying a refrigerant or fluid for absorbing heat and conduits for carrying away gas phase refrigerant or other gas phase product back to a compressor as will be explained below. The cover is generally square with each side measuring about forty millimeters. The cover may be 0.5 to 1.0 millimeter thick. Attached to the evaporator 28 by a thermally conductive adhesive tape or the like 51 is a microscale heat generating device, such as a microprocessor 53. Because the evaporator is formed of heat conducting material, as described below, heat from the microprocessor is conducted to the evaporator.

Referring now to FIGS. 8–11, the base 26 is also a generally flat plate having first surface 56 and second surface 58. The first surface 56 abuts and is sealed to the inside surface 40 of the cover. Formed in the first surface of the base is a capillary passage 60 having as a top wall the inside surface 40 of the cover 24. The capillary passage has an upstream end 62 and a downstream end 64. The upstream end 62 aligns with the inlet port 34 of the cover 24 so that liquid pumped to the inlet port enters the capillary passage 60. The capillary passage may be serpentine to allow its length to be adjusted as desired by forming more or less loops. The length of the capillary passage depends upon the fluid used and the heat lift capacity desired as well as other factors. The cross-sectional dimensions of the capillary passage are also related to the length of the capillary passage. They balance flow, ability to pump and provide the required pressure drop. The downstream end 64 of the capillary passage adjoins an opening 66 in the base 26. The capillary passage may be formed in the base by molding or by hot embossing or by any other convenient manufacturing technique known or developed in the future. Generally, the capillary passage is square shaped in cross section having a side dimension of about two hundred fifty microns. The passage may be semicircular or trapezoidal in shape and corners may have a radius. The base 26 may have a thickness of about one millimeter.

The base 26 also includes a second opening 68 which aligns with an elongated recess 70. A far end portion 72 of the recess aligns with the outlet port 36, FIG. 5, in the cover 24. The base may also includes a sealing ridge 74 around the periphery of the first surface 56. The sealing ridge facilitates assembly of the cover to the base by ultrasonic welding, laser welding or RF welding, processes which are well known to those skilled in the art. Extending from the second surface 58 is a mounting flange 76. The flange 76 will engage a lip of the evaporator 28, FIG. 3, as will be explained below. The mounting flange has an oblong hexagonal shape as is readily seen in FIG. 10.

The fluid referred to above may be any heat transferring fluid including a refrigerant, such as those known as R236fa, R123, R134a, R124, or $CO_2$. Also, any suitable dielectric fluid or other suitable refrigerant may be used as is well known to those skilled in the refrigerant art. Further, other heat transferring fluids may be used, such as DYNALENE, FLUORINET, NOVEC, FLUTEC and a liquid slurry with encapsulated phos change materials (PCM). As is also well understood to those skilled in the art, the liquid is formed by compressing a gas to its liquid phase and then cooling the liquid before being exposed to heat. Upon the transfer of heat, the liquid again returns to a gas phase, or the liquid is pumped in and picks up heat via forced convection (remains liquid) or by flow or pool boiling where it becomes a gas or gas mixture which is later condensed back to a liquid. Other fluids can also be used as is well known to those skilled in the art.

The evaporator 28 is a thermally conductive element in the form of a metal plate 80 with a number of projections or fins 82, as they are usually called, mounted to an inside surface 84. An outside surface 86 of the evaporator is generally flat and is adapted to be connected to a heat source such as a microprocessor. The evaporator may also be connected to other small heat generating mechanisms, such as transistors, power semiconductors, laser optical IGBTs or other electronic or opto-electronic devices. The term "microsystem" is used here to refer to all such items and others, whether now in existence or developed in the future. The evaporator is formed of a material having high thermal conductivity, such as copper or aluminum. The evaporator is attached to the base by an convenient means, such as molding the base to the evaporator or using other techniques known by those in the art. The evaporator 28 includes a lip 88 around its periphery which may form an interference fit with the mounting flange 76 of the base 26. See also FIG. 16. The evaporator may be connected to a microsystem by a thermal adhesive, thermal pad, or an evaporator may be molded or formed as a part of the microsystem should that prove more effective or efficient. (See FIG. 2.) All of these are commercially available and add considerable flexibility to the design.

Figure 16:
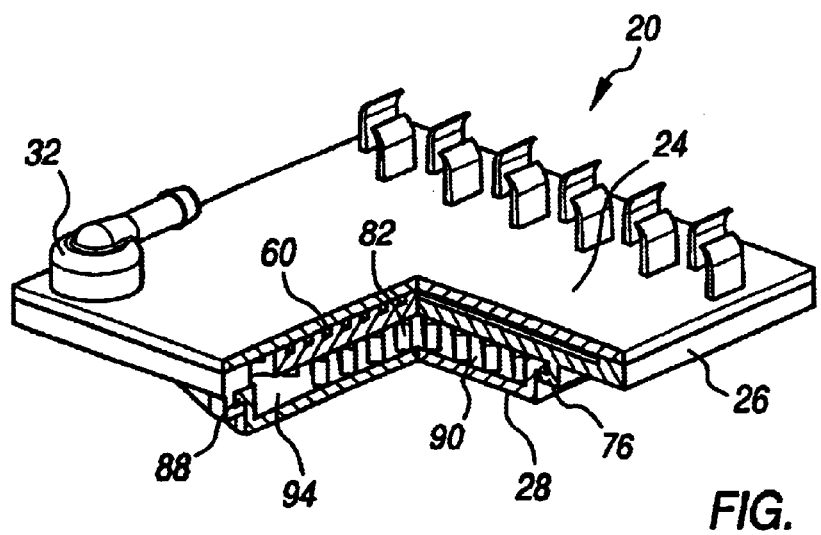
FIG. 16 is a sectional isometric view of the cooling assembly.
Figure 17:
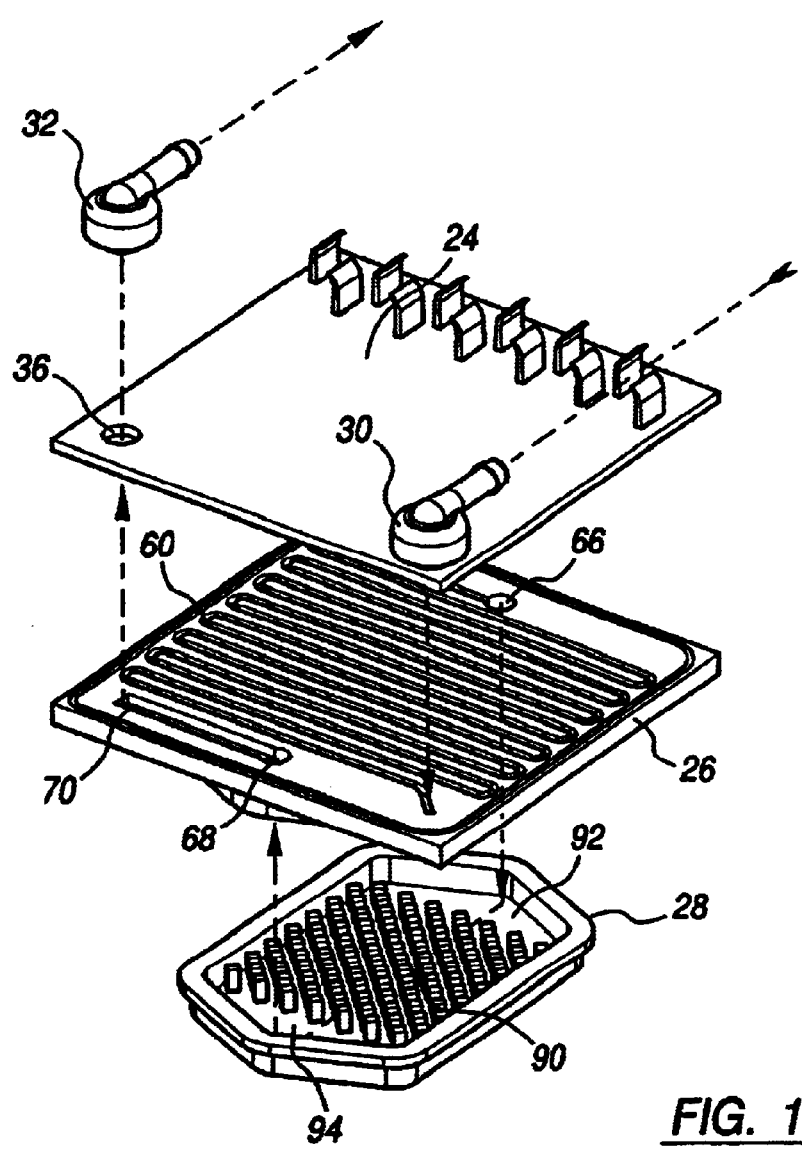
FIG. 17 is an exploded isometric view of the cooling assembly.

An evaporator chamber 90, FIGS. 16 and 17, is formed between the evaporator 28 and the base 26, downstream of the capillary passage 60 and upstream of the outlet port 36 and among the fins 82. An expansion zone 92 is also formed between the evaporator and the base, and more particularly immediately downstream of the opening 66. The expansion zone is also immediately upstream of the evaporator chamber 90. This allows liquid in the capillary passage to cool in the expansion zone 92 and then pass into the evaporator chamber where pool boiling occurs among the fins.

When passing through the evaporator chamber, the heat transferring fluid will change phase to a gas or remain liquid when absorbing heat from the evaporator. The gas or liquid proceeds to a collection region 94 downstream of the evaporator chamber before exiting through the outlet port 36 and back to a compressor, not shown.

Figure 18:
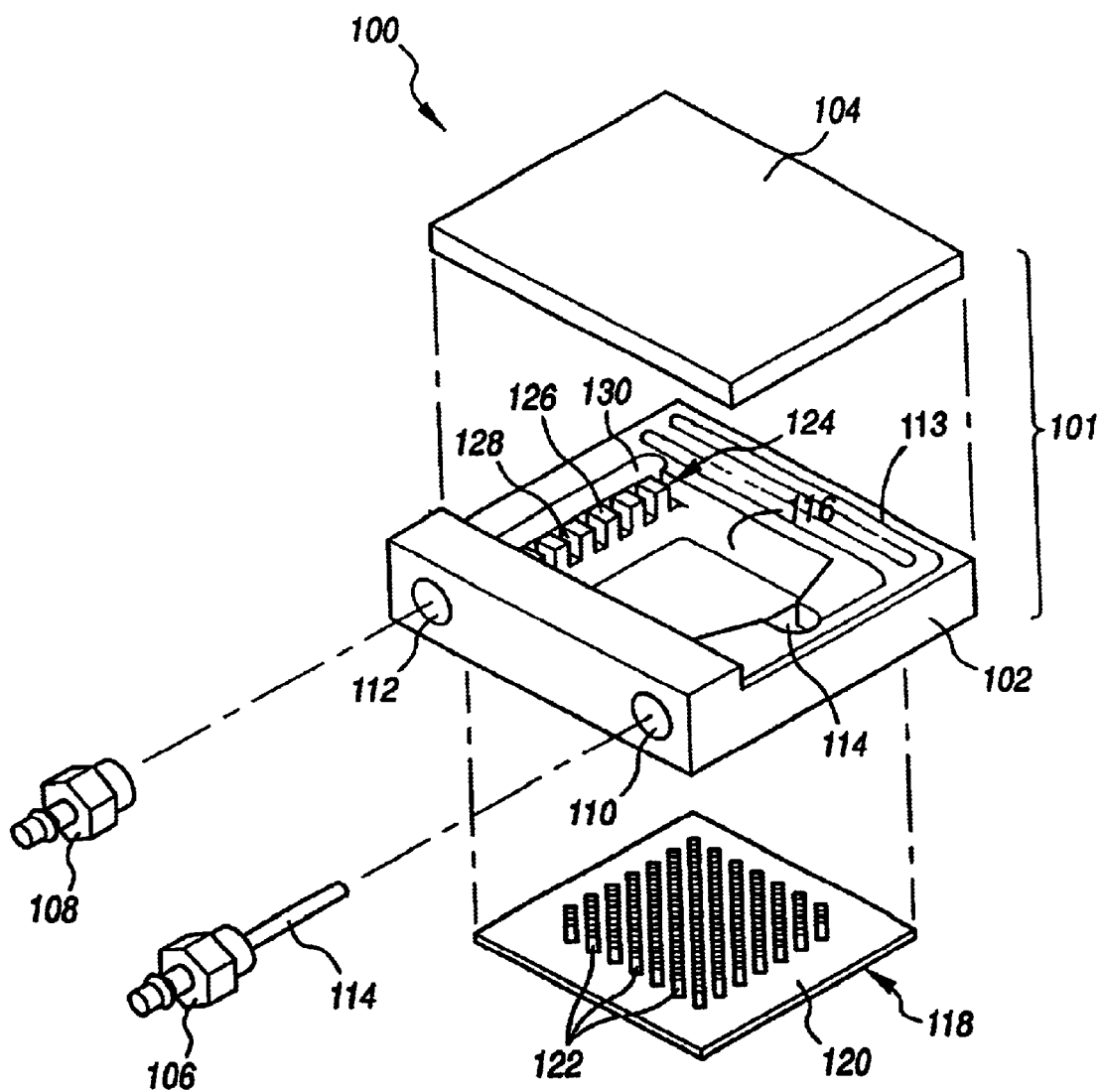
FIG. 18 is an exploded isometric view of a cooling assembly having a construction different from that of the FIG. 1 embodiment.

Referring now to FIG. 18, a cooling system 100 with a slightly different construction is disclosed. A housing 101 includes a base 102 and a cover 104. Inlet and outlet fittings 106, 108 are located in inlet and outlet ports 110, 112, respectively. A capillary tube 113 is connected to the inlet fitting 106. An expansion port 114 is formed in the base 102 and an evaporator chamber 116 is also formed in the base. An upper wall of the evaporator chamber is formed by the cover 104. A lower wall of the evaporator chamber is formed by an evaporator 118 and includes a plate 120 with a multitude of fins 122. Downstream of the evaporator chamber is a region 124 which includes upstanding blocks, such as the block 126 which alternate with passageways between the blocks, such as the passageway 128. The blocks form multiple exhaust ports to help separate flow to make more efficient use of the evaporator, to minimize orientation effects, to reduce pressure drop and to minimize blockage due to contamination. Downstream of the blocks is a passage 130 which is upstream of the outlet port 112. Like the assembly in FIG. 1, the construction of FIG. 18 includes a high thermally conductive evaporator and low thermally conductive cover and base.

In operation, the refrigerant is at a high pressure state when delivered to the inlet fitting 30, FIG. 17. In a construction where R236 is the refrigerant and a heat lift of 50 watts is sought, the inlet pressure is about 55 psi, the flow rate is about 0.00055 kilograms per second and the capillary passage 60 is about two inches long and may have a square cross section of about 0.250 millimeters per side. The length of the cooling system is about 40 millimeters, the width about 40 millimeters and the height about 7 millimeters. The pins in the evaporator chamber may be about 1 millimeter square in cross section and about 5 millimeters in height. With such an arrangement, a Pentium brand microsystem may have a surface temperature maintained within the range of −20 to 50° C., depending on application and fluid selected.

The refrigerant is compressed in a compressor and cooled by a condenser before entering the capillary passage 60. A heat transfer fluid may be pumped. Thereafter, the refrigerant expands, absorbs heat by pool boiling, forced convection or flow boiling (or a combination of these) in the evaporator chamber 90, leaves through the opening 68 in the base and the outlet port 36 before returning to the compressor for the start of a new cycle. Should more heat lift be desired, the capillary passage may be enlarged, the inlet pressure increased, and/or the evaporator charged to a material having a higher heat conductivity. The circulating liquid may also be changed. If less heat lift is needed, the capillary passage size may be reduced, the flow rate lessened, the refrigerant altered and/or the like. Other variables may also change. There is no intention to limit the invention here due to changes in the amount of heat lift required or desired.

The pressure drop provided by the capillary passage is proportional to L divided by $d^2$ where L is length and d is hydraulic diameter. The advantage of a design that accommodates a long capillary passage is that the width and depth may be proportionately larger. This is beneficial so that the passage will be resistant to clogging. Also, a larger dimensioned passage may be easier to consistently manufacture.

The specification describes in detail embodiments of two variations of the present invention. Other modifications and variations will under the doctrine of equivalents or otherwise come within the scope of the appended claims. For example, as mentioned, enlarging the capillary passage or making it longer or changing the refrigerant or other liquid used to transfer heat or using aluminum rather than cooper for the evaporator all are considered equivalent structures. Still other alternatives will also be equivalent as will many new technologies. There is no desire or intention here to limit in any way the application of the doctrine of equivalents or the scope of the claims.

What is claimed is:

1. A microscale cooling system comprising:
a thermally insulative housing operatively connected to an inlet port and an outlet port;
a capillary passage formed downstream of said inlet port within said housing;
a thermally conductive element connected to said housing, said thermally conductive element forming with said housing a pool boiling chamber and an expansion zone; and
a plurality of thermally conductive projections mounted to said thermally conductive element and extending into said pool boiling chamber wherein heat transferring fluid flowing from said capillary passage cools in said expansion zone before absorbing heat in said pool boiling chamber.

2. The system as claimed in claim 1 wherein:
said thermally conductive element includes an outside surface adapted to be connected to a microscale heat generating device.

3. The system as claimed in claim 2 wherein:
pressure at said inlet port is about 55 psi, flow rate of a heat transferring fluid is about 0.0005 kilograms per second, said capillary passage is about two inches long with a square cross section of about 0.250 millimeters per side and said thermally insulative housing and connected thermally conductive element has outer dimensions of about forty millimeters in length, about forty millimeters in width and about seven millimeters in height.

4. The system as claimed in claim 3 wherein:
each of said plurality of projections in the pool boiling chamber is about one millimeter square in cross section and about five millimeters long.

5. A microscale cooling system comprising:
a thermally insulative housing having an inlet port and an outlet port;
a capillary passage formed downstream of said inlet port within said housing;
a thermally conductive element connected to said housing, said thermally conductive element forming with said housing a pool boiling chamber; and
a plurality of thermally conductive projections mounted to said thermally conductive element and extending into said pool boiling chamber wherein heat transferring fluid is throttled in said capillary passage and absorbs heat in said pool boiling chamber.

6. The system as claimed in claim 5 wherein:
said thermally conductive element includes an outside surface adapted to be connected to a microscale heat generating device.

7. The system as claimed in claim 6 wherein:
pressure at said inlet port is about 55 psi, flow rate of a heat transferring fluid is about 0.0005 kilograms per second, said capillary passage is about two inches long with a square cross section of about 0.250 millimeters per side and said thermally insulative housing and connected thermally conductive element has outer dimensions of about forty millimeters in length, about forty millimeters in width and about seven millimeters in height.

8. The system as claimed in claim 6 wherein:
each of said plurality of projections in the pool boiling chamber is about one millimeter square in cross section and about five millimeters long.

9. A microscale cooling system comprising:
a housing formed of thermally insulative materials;
a thermally conductive structure connected to said housing, said thermally conductive structure forming with said housing a chamber; and
a single capillary passage formed in said housing and in communication with said chamber; and wherein
said thermally conductive structure includes an outer surface for connecting to a heat generating device;
said thermally conductive structure includes a plurality of projections; and
said chamber is a pool boiling chamber.

10. The system as claimed in claim 9 wherein:
said plurality of projections are aligned in rows.

11. The system as claimed in claim 10 wherein:
said plurality of projections are obliquely aligned.

12. A microscale cooling system comprising:

a first housing layer of thermally insulative material having a first portion and a second portion;

an exposed elongated fluid passage formed in said first portion of said first housing layer;

a second housing layer of thermally insulative material having an inlet port, an outlet port, a mating surface and an absence of an elongated fluid passage, said mating surface of said second housing layer being attached to said first portion of said first housing layer for enclosing said elongated fluid passage to form a capillary of predetermined cross section and length;

a third layer formed of thermally conductive material attached to said second portion of said first housing layer and forming with a wall of said first housing layer a chamber, said third layer having first and second surfaces;

a plurality of small, cross-sectioned projections extending from said first surface of said third layer into said chamber constructed to engage a fluid flowing from said capillary wherein heat is transferred from said projections to said fluid; and a fourth layer of thermally conductive material attached to said second surface of said third layer for connecting a heat generating electronic device to said third layer.

* * * * *